(12) United States Patent
Wang (10) Patent No.: US 11,764,725 B1
(45) Date of Patent: Sep. 19, 2023

(54) FOLDABLE PORTABLE LOAD DISTRIBUTED DUAL AXES LIGHTWEIGHT SOLAR TRACKER

(71) Applicant: Yonghua Wang, Klamath Falls, OR (US)

(72) Inventor: Yonghua Wang, Klamath Falls, OR (US)

(73) Assignee: Yonghua Wang, Klamath Falls, OR (US)

( * ) Notice: Subject to any disclaimer, the term of this patent is extended or adjusted under 35 U.S.C. 154(b) by 0 days.

(21) Appl. No.: 17/803,535

(22) Filed: Aug. 13, 2022

(51) Int. Cl.
*H02S 20/32* (2014.01)
*H02S 30/20* (2014.01)
*F24S 30/45* (2018.01)
*F24S 30/00* (2018.01)

(52) U.S. Cl.
CPC .............. *H02S 20/32* (2014.12); *F24S 30/45* (2018.05); *H02S 30/20* (2014.12); *F24S 2030/133* (2018.05); *F24S 2030/134* (2018.05); *F24S 2030/136* (2018.05)

(58) Field of Classification Search
CPC .... H02S 20/32; H02S 30/20; F24S 2030/134; F24S 2030/133; F24S 2030/136
See application file for complete search history.

(56) References Cited

U.S. PATENT DOCUMENTS

| 2012/0199175 A1* | 8/2012 | Koningstein | F16H 1/22 136/246 |
| 2019/0002127 A1* | 1/2019 | Straus | B64F 1/007 |
| 2020/0403560 A1* | 12/2020 | Casla Urteaga | H02S 10/40 |

\* cited by examiner

*Primary Examiner* — Jayne L Mershon (57) ABSTRACT

A foldable portable load distributed lightweight dual-axis tracker with solar panels consists of a foldable pedestal with spokes and tracks, a foldable rotating spoke-platform with spokes equipped with sprocket gears on top of the pedestal, a motor with a sprocket gear, a front supporting structure with a hinge, a rear supporting structure with sprocket gears connected with chains, solar panels with cables. The motor is connected to the hub-platform through a chain. The motor drives the spoke-platform to rotate around a vertical axis at the center of the pedestal. The sprocket gears and the chains lift the solar panels to rotate them around the hinge mounted on the front supporting structure. The foldable hub-platform is expanded by the foldable lattice girders. The load of the tracker is distributed among the wheels sitting on the tracks of the pedestal.

9 Claims, 12 Drawing Sheets

FOLDABLE PORTABLE LOAD DISTRIBUTED DUAL AXES LIGHTWEIGHT SOLAR TRACKER

TECHNICAL FIELD

The present disclosure relates generally to solar tracker, more specifically, to foldable portable load distributed dual axes lightweight solar tracker.

BACKGROUND

Facing to environment crisis and energy crisis, the modern society of the world is accelerating in transition to renewable energy. Renewable energy resources such as solar energy are abundant, clean, and ubiquitously available over the world. It is without doubt that renewable energy will ultimately substitute fossil fuel. However, at present, renewable energy is not yet economically competitive over fossil fuel. The reason for that stems from energy density and continuity. The energy density of fossil fuel is orders of magnitude higher than that of renewable energy and fossil fuel is a constant energy resource. Average solar radiation intensity on earth is around 800 $W/m^2$, varying with location, weather and season. Relative to fossil fuel, the major issues of solar energy that cause low efficiency and high cost of solar systems stem from the low energy current density of solar radiation. When the flat plate photovoltaic panel is installed to intercept the sunlight, the large area semiconductor devices are directly employed to collect and convert the diffusive solar energy. Large area costly semiconductor makes the conventional solar system expensive. In order to reduce the area of semiconductor converter, usually large area solar concentrator is used to condense solar radiation before the converter is used to convert it into electric power. The relative low cost of solar concentrator substantially reduces the cost of solar collector. While, as the development of conventional silicon photovoltaic technology and the wide-spread adoption of flat plate photovoltaic systems, the fall of the cost of conventional silicon photovoltaic system makes any concentrating system un-plausible. The cost of flat plat silicon photovoltaic panel approaches the cost of conventional concentrating systems. However, the cost of the solar generated electricity is still away higher than fossil fuel generated electricity. The conventional flat plate photovoltaic technology has been pushed to its theoretical limits, there is no room to further dramatically reduce its cost and raise its efficiency. A new approach must be explored to extraordinarily reduce the cost of solar concentrator so that the trend of cost falling for solar power systems remains. Inflatable solar concentrator is able to concentrate sunlight using membranes or films and reflective coating with extremely low cost. Therefore, inflatable solar concentrator provides a path leading to extremely low cost solar power systems and radically reducing the cost of solar energy utilization. U.S. Pat. No. 11,365,903 B2 to Yonghua Wang discloses an "Inflatable Non-imaging Solar Concentrator" that has potential to extraordinarily drop the cost of solar concentrator down to a extremely low level. Due to the super-lightweight attribution of the inflatable non-imaging solar concentrator, super-lightweight foldable and portable tracker is needed to fully explore the potential of this type of solar concentrator and realize ultra-high efficiency and extremely-low cost solar conversion.

U.S. Pat. No. 4,832,001 to Baer disclosed a "Lightweight Solar Panel Support" for one or more solar panels. In Baer' disclosure, a compression frame is mounted to the supporting surface, and tension members extend laterally from the frame in opposite directions to the supporting surface. The solar panels are attached to one of the tension members in a fashion which allows the solar panel to rotate and so that the panels can follow the sun throughout the day. Apparently, Baer's solar panel support is of sufficient lightweight, but neither foldable, nor portable. Furthermore, Baer's lightweight solar tracker is not feasible for being deployed to construct inflatable non-imaging solar concentrator based Concentrating Solar Power (CSP) system.

U.S. Pat. No. 8,237,098 B2 to Saldana discloses a Dual-Axis Solar Tracker. Saldana's solar tracker consists of a moving supporting system for solar panels, which maximizes the energy production of said panels and which is formed by a vertical axle and a horizontal axle in relation to which the system rotates in order to track the Sun's path. The aforementioned axles are components of a structure supported at the center and supported peripherally on wheels positioned on a running track or Surface. The structure rotates about a fixed central point supporting the vertical axle of the tracker. At least one board is positioned on the horizontal axle of the structure in order to receive the solar modules or panels and said board(s) can rotate about the horizontal axle so that the solar panels are maintained perpendicular to the sun's rays. In Saldana's invention, the all load of the moving parts is distributed onto the wheels positioned on a running track of surface, unlike the single pole solar tracker structure, in which, all load of the moving parts is transferred to the driving mechanism located at the top of the pole. The design of the single pole tracker results in bulky and heavy supporting structure and easy damage of the driving mechanism. However, Saldana's structure is still bulky and heavy, and its driving mechanism is still not that reliable.

The objective of the present invention is to provide a dual-axis tracker that is super-lightweight, foldable, and portable for constructing the inflatable non-imaging solar concentrator based CSP system to realize ultra-high efficiency extremely low cost solar energy conversion.

SUMMARY

The entire tracker consists of 4 major sections: 1) a foldable platform that can rotate around a vertical axis; 2) a foldable supporting structure that has at least 2 sets of sprocket gear assemblies; 3) a board that can rotate around a horizontal axis for mounting solar panels; 4) a motor with a sprocket gear for driving chain. In the structure of the present tracker, the board is mounted on the foldable platform with a hinge at one end and the supporting structure with sprocket gear assemblies at the other end, so that the board can rotate around an axis along the hinge through the sprocket gear assemblies. When in operation, the foldable platform is driven by the motor through the chain connecting the sprocket gear and the sprocket gears of the foldable platform; the board of solar panels is driven by the sprocket gear assemblies mounted on the supporting structure.

The foldable platform is composed of a central axel with a bearing ring, a few of hubs with sprocket gears on one ends and joints on other ends, foldable lattice girders in between the hubs, a chain, wherein, the hubs are connected to the bearing ring of the central axel at one end, and all of the hubs are connected each other with the chain at the other ends. The entire foldable platform is connected to the motor with a sprocket gear through the chain. The foldable supporting structure is mounted on the foldable platform through a hinge. The board is mounted the foldable platform through a hinge at the periphery of the foldable platform at one end. The board is connected to the foldable supporting structure through the sprocket gear assemblies at the other end.

From the structure of the tracker and its work principle, it becomes apparent that the load of the entire system is distributed among the wheels contacting the track or ground surface, therefore the structure components such as the hubs can be made very thin and lightweight; due to the long torque arms, the driving forces needed to drive the foldable platform and the board of solar panels can be small; the entire system is foldable and portable.

Further aspects and advantages of the present invention will become apparent upon consideration of the following description thereof, reference being made of the following drawing.

BRIEF DESCRIPTION OF THE DRAWINGS

The accompanying drawings, which are incorporated in and constitute a part of this specification, illustrate several embodiments of the invention and together with the description, serve to explain the principles of the invention.

DETAILED DESCRIPTION

Reference will now be made in detail to the present exemplary embodiments, examples of which are illustrated in the accompanying drawings. Wherever possible, the same reference numbers will be used throughout the drawings to refer to the same or like parts.

Figure 1:
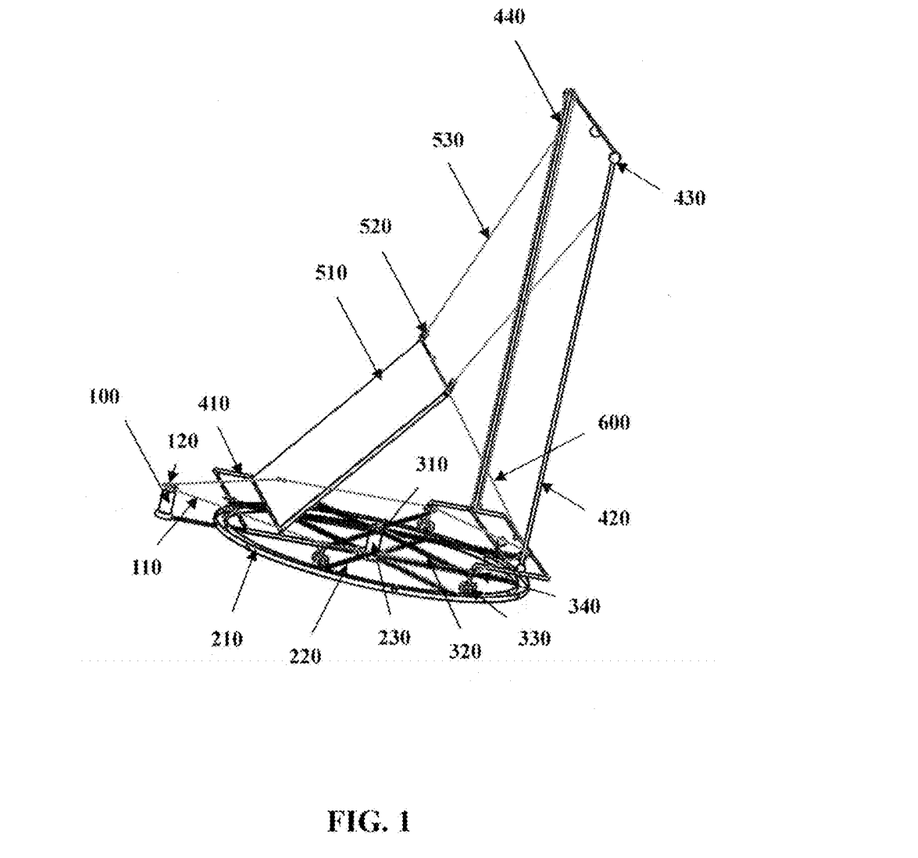
FIG. 1 is overview of the foldable portable load distributed lightweight dual-axis tracker with solar panels.

Referring to FIG. 1, the foldable portable load distributed lightweight dual-axis tracker with solar panels comprises: 1) motor 100 with motor sprocket gear 120; 2) pedestal 230 with spoke-pedestal spokes 220 and tracks 210; 3) rotational spoke-platform with bearing ring 310, spoke-platform spokes 320 equipped with spoke-platform spoke sprocket gears 340 and wheels 330, and drive loop chain 110; 4) front supporting structure 410, rear supporting structure 420 with rear supporting structure sprocket gears 430 and rear supporting structure chains 440; 5) solar panels 510 with solar panel joints 520 and cables 530; 6) vehicle safety seat belt 600;

wherein, the motor 100 is connected to the rotational spoke-platform through the drive loop chain 110; the rotational spoke-platform is mounted on the top of the pedestal 230 through the bearing ring 310 and a axel of the pedestal, as well as the wheels 330 sitting on the tracks 210; the front and rear supporting structure 410 with a horizontal hinge axel and 420 with the rear supporting structure sprocket gears 430 connected with rear supporting structure chains 440 are mounted on the top of the spoke-platform through the spoke-platform sprocket gears 340 and wheels 330; the solar panels 510 are mounted on the supporting structures and connected to the rear supporting structure chains 440 through the solar panel joints 520 and cables 530; the solar panels are further connected to the rear supporting structure 420 through a vehicle safety seat belt 600;

wherein, in operation, the motor 100 drives the spoke-platform to rotate around a vertical axel of the pedestal 230; the rear supporting structure sprocket gears 430 drive rear supporting structure chains 440 to lift the solar panels making them rotating around the hinge amounted on the front supporting structure 410. When wind is blowing from backside of the solar panels, the vehicle safety seat belt will help to maintain them on the supporting structure.

Figure 2:
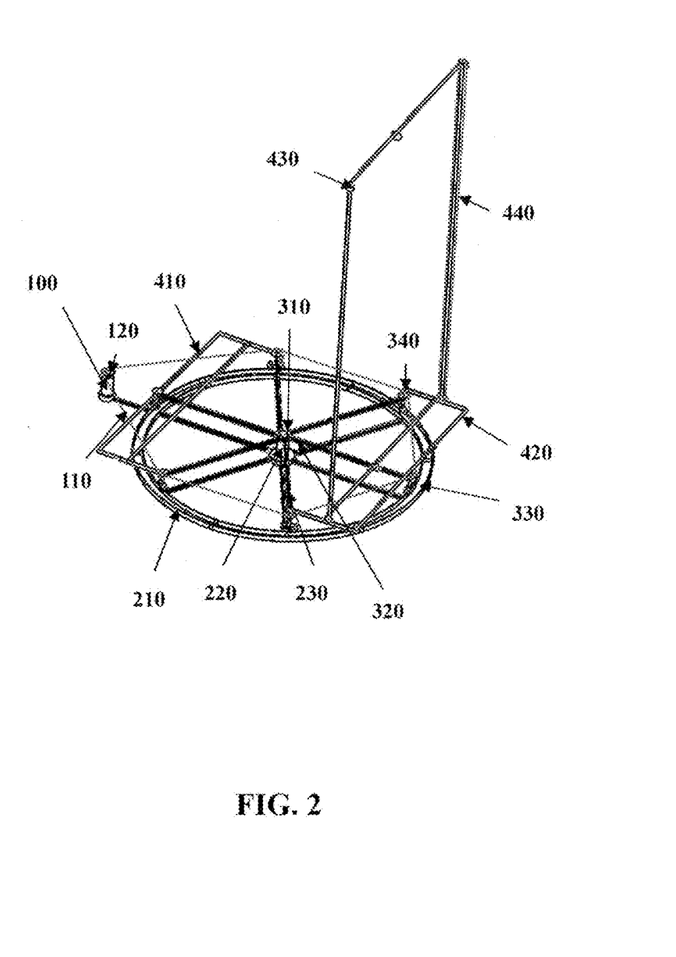
FIG. 2 is a schematic drawing of the foldable portable load distributed lightweight dual-axis tracker without solar panels.

Referring to FIG. 2, the motor sprocket gear 120 on top of the motor 100 is connected to the spoke-platform sprocket gears 340 on tops of the poke-platform spokes 320 of the spoke-platform forming a loop through the drive loop chain 110 to drive the spoke-platform rotating around the axel at the pedestal 230.

Figure 3:
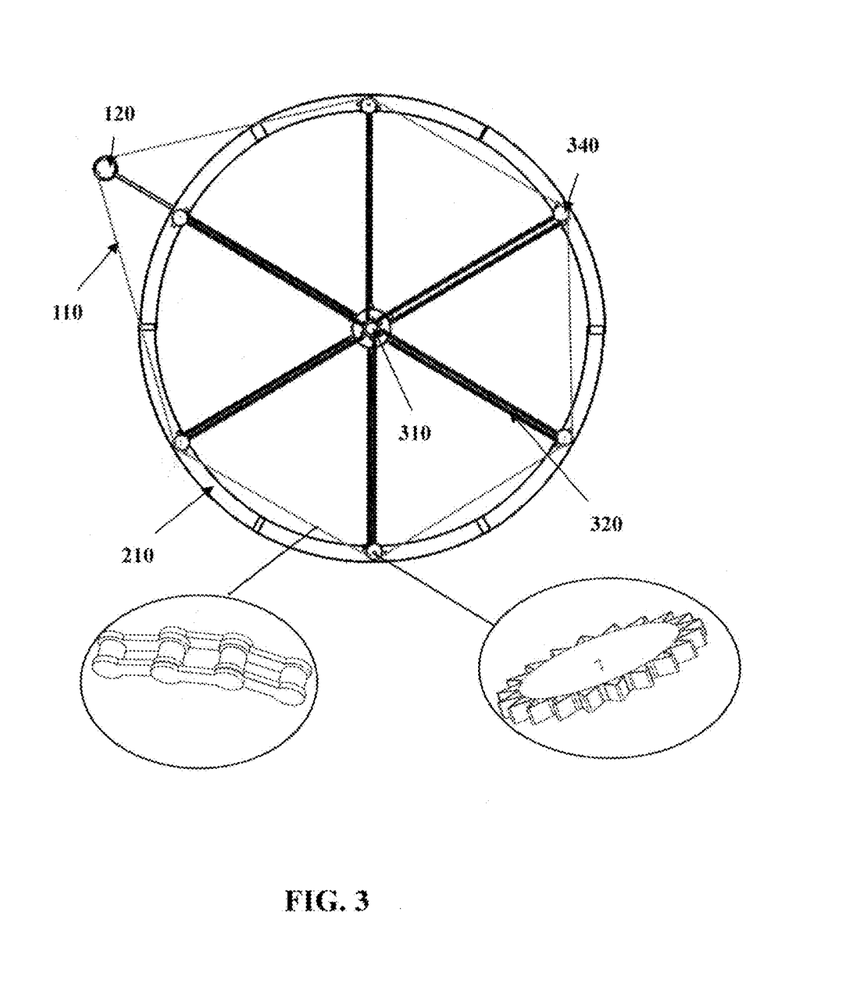
FIG. 3 is a schematic drawing of the foldable portable load distributed lightweight dual-axis tracker without solar panels and front and rear supporting structure and rotation mechanism around the horizontal axis.

Referring to FIG. 3, the structures of the motor sprocket gear and the rear supporting structure chain are shown.

Figure 4:
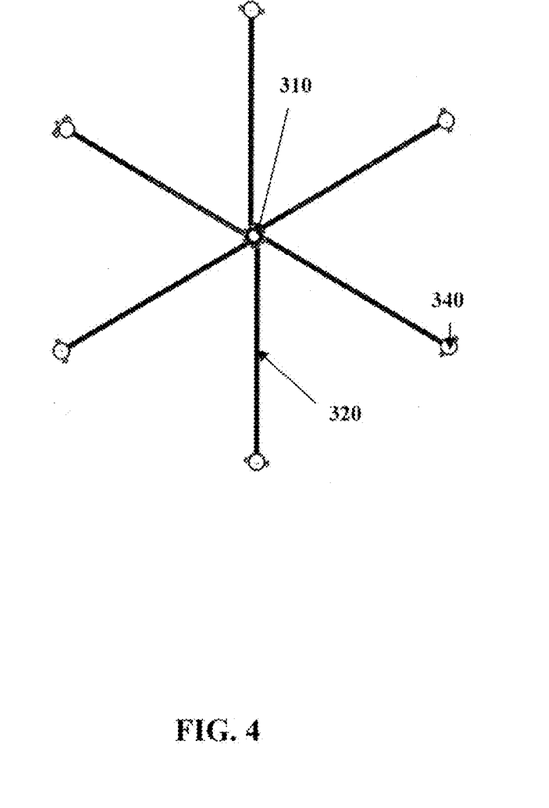
FIG. 4 is a schematic drawing of the moveable and foldable hub-platform with the hubs equipped with sprocket gears.

Referring to FIG. 4, the structure of the spoke-platform with bearing ring 310, spoke-platform spokes 320, and spoke-platform sprockets 340 is shown.

Figure 5:
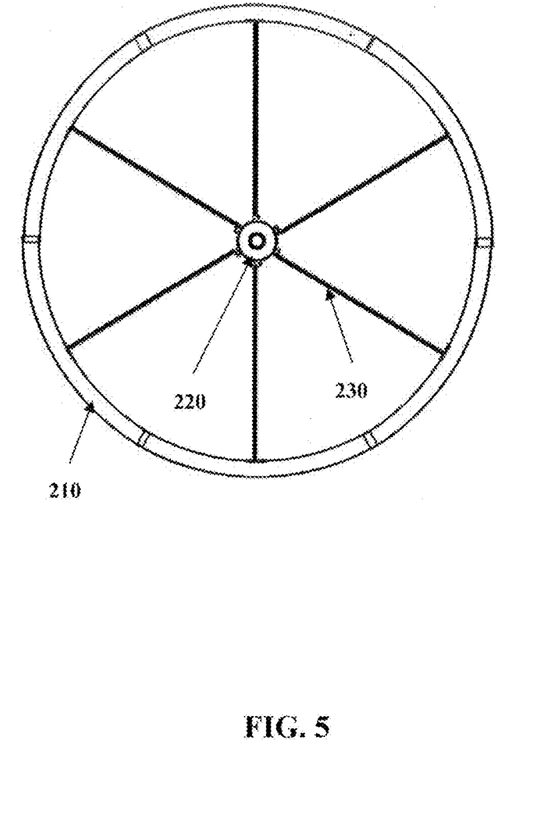
FIG. 5 is a schematic drawing of the foldable portable pedestal with tracks.

Referring to FIG. 5, the structure of pedestal 230 with spoke-pedestal spokes 220 and tracks 210 is shown.

Figure 6:
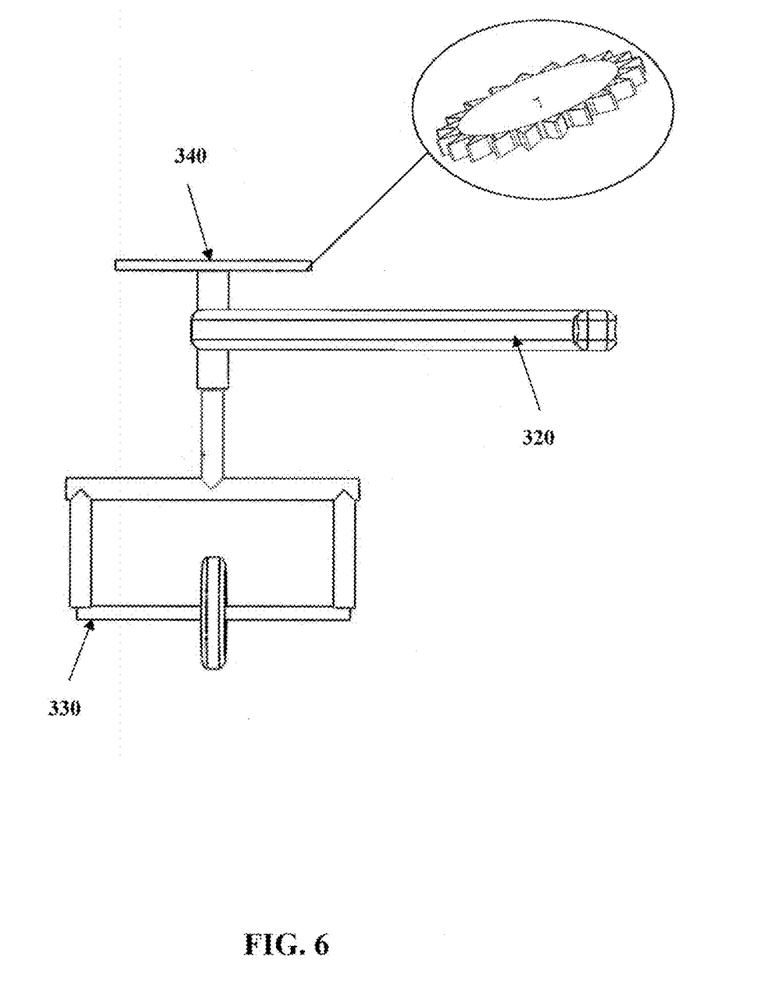
FIG. 6 is the detail view of hub of the hub-platform with sprocket gear and wheel sitting on track of the pedestal.

Referring to FIG. 6, the spoke-platform sprocket gear 340 and the wheel 330 are mounted on one end of the spoke-platform spokes 320.

Figure 7:
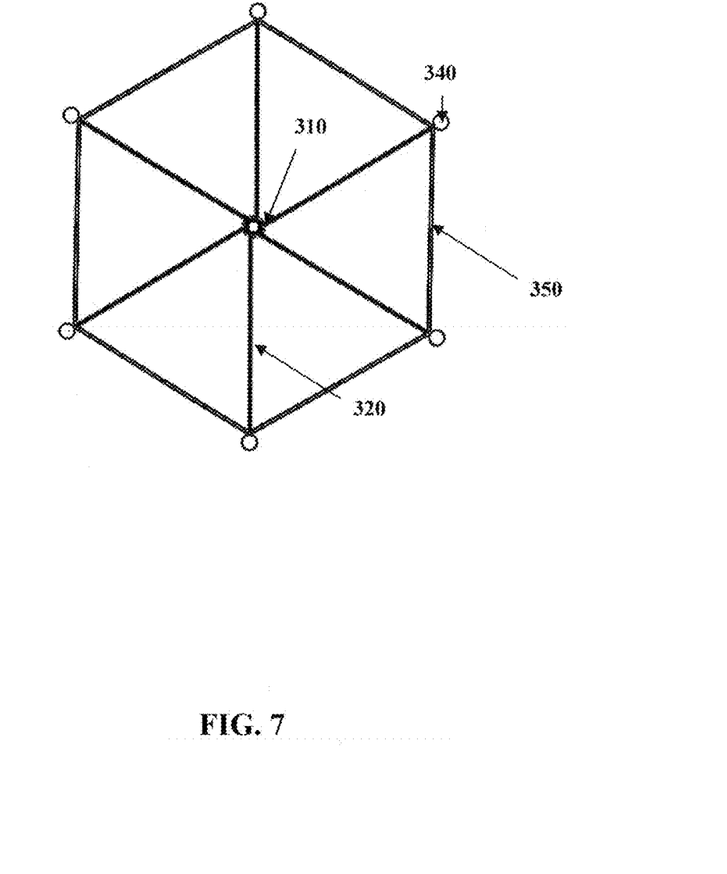
FIG. 7 is a schematic drawing of the foldable hub-platform with foldable lattice girders.

Referring to FIG. 7, foldable lattice girders 350 is added into the structure of the foldable spoke-platform to make it fastened.

Figure 8:
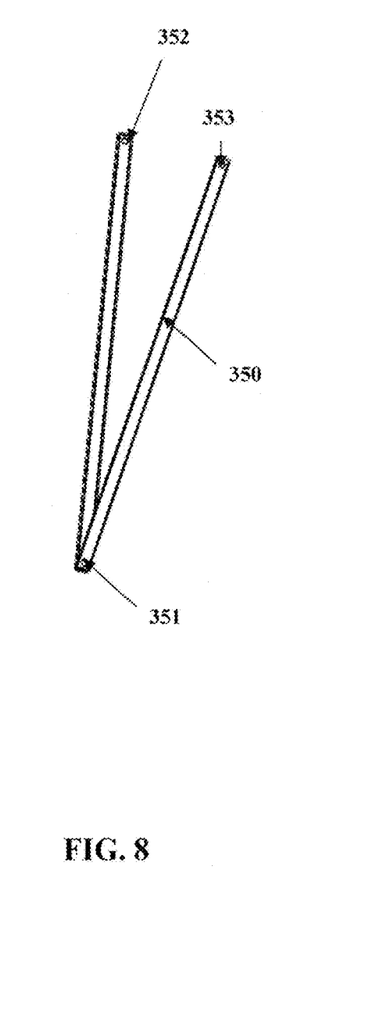
FIG. 8 is a detail view of the foldable lattice girders.

Referring to FIG. 8, the foldable lattice girder is formed through the joint 351.

Figure 9:
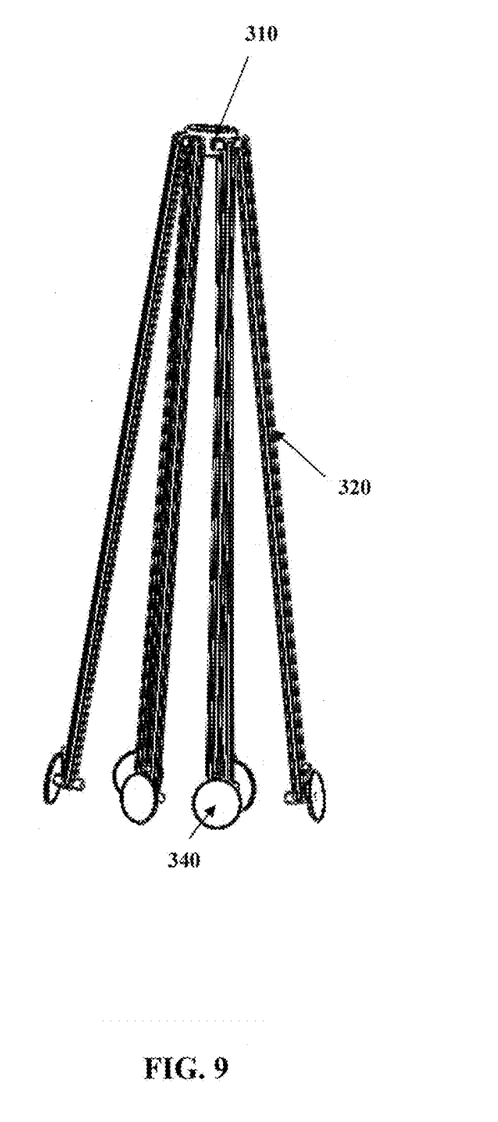
FIG. 9 is a schematic drawing of the folded hub-platform without foldable lattice girders.

Referring to FIG. 9, the foldable spoke-platform without lattice girders is folded.

Figure 10:
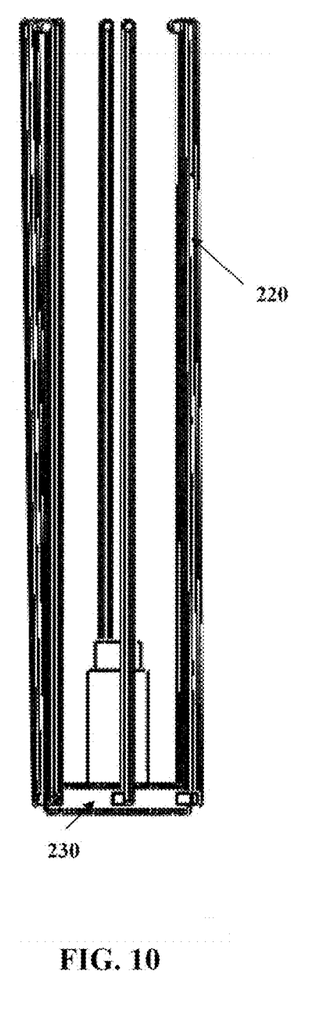
FIG. 10 is a schematic drawing of the folded pedestal without tracks.

Referring to FIG. 10, the foldable pedestal without tracks is folded.

Figure 11:
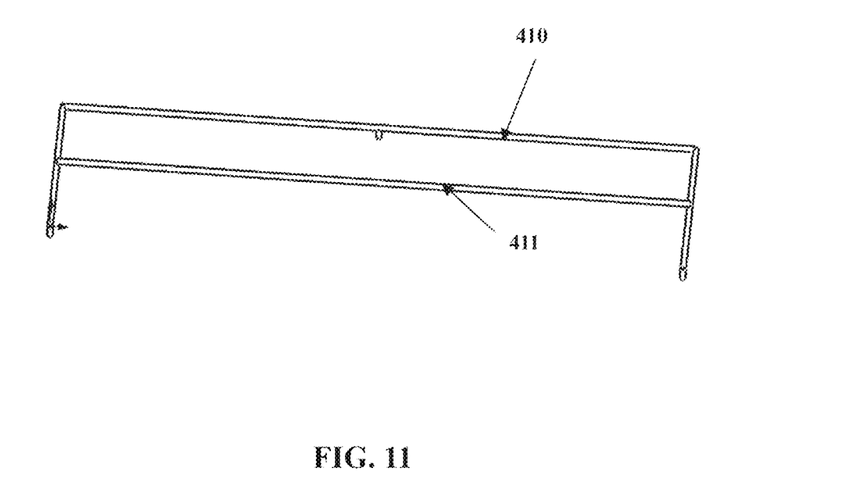
FIG. 11 is a schematic drawing of the front supporting structure for horizontal rotation of the solar panels.

Referring to FIG. 11, the front supporting structure 410 has the hinge 411 around which the solar panels can be rotated through lifting the other end of the solar panels.

Figure 12:
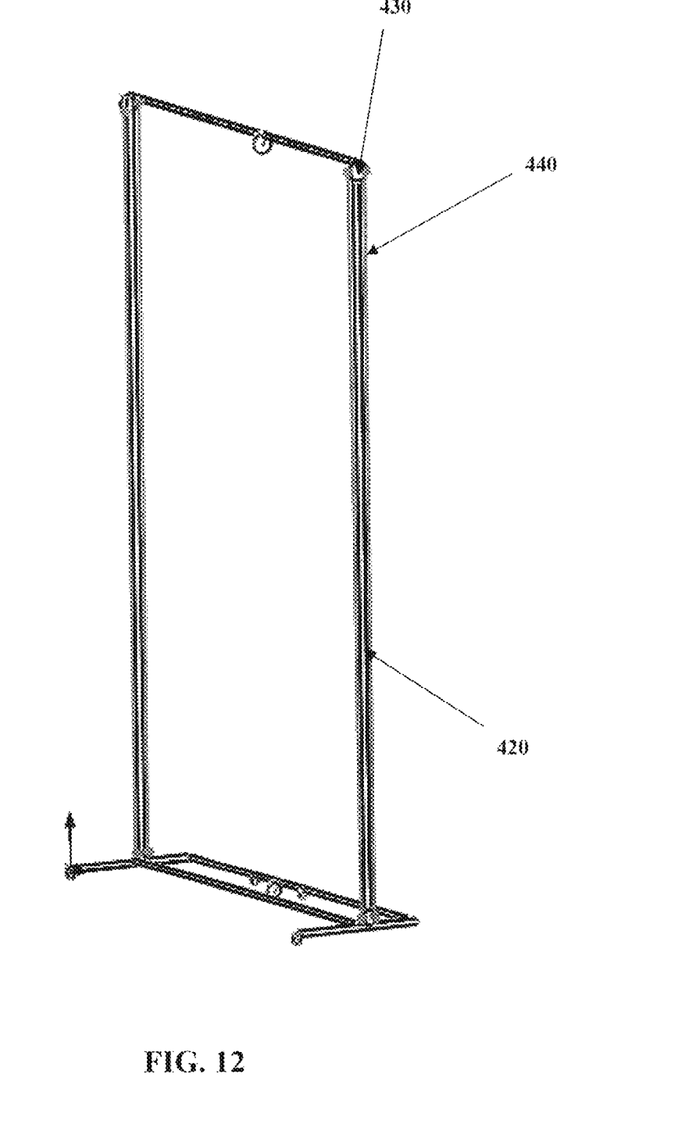
FIG. 12 is a schematic drawing of the rear supporting structure for horizontal rotation of the solar panels.

Referring to FIG. 12, the rear supporting structure sprocket gear 430 drives the rear supporting structure chain 440 to lift the solar panels tied to the rear supporting structure chains with cables at their one end to rotate the solar panels around the hinge on the front supporting structure.

From the description above, a number of advantages of the solar tracker become evident. All load of the structure is distributed among the wheels peripherally positioned on the tracks and the pedestal at the center of the system, so that all hubs, lattice girders, and supporting structures can be made with thin and lightweight materials. The entire system is foldable and portable. The sprocket gear and chain deployed to drive the system provide reliable driving mechanism. Due to the large arms of the driving structures, small forces are needed to generate the same torques to drive the system to track the sun.

In the preceding specification, various preferred embodiments have been described with reference to the accompanying drawings. It will, however, be evident that various other modifications and changes may be made thereto, and additional embodiments may be implemented, without departing from the broader scope of the invention as set forth in the claims that follow. The specification and drawings are accordingly to be regarded in an illustrative rather than restrictive sense.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

I claim:

1. A foldable portable load distributed lightweight dual-axis tracker with solar panels comprises:
   1) A motor including a motor sprocket gear;
   2) A drive loop chain;
   3) A pedestal including pedestal spokes, and pedestal tracks;
   4) A rotational spoke-platform including a bearing ring, a plurality of rotational spokes connected to a plurality of spoke-platform sprocket gears, each spoke-platform sprocket gear associated with a hub-platform wheel;
   5) A front supporting structure;
   6) A rear supporting structure, with rear supporting sprocket gears and rear supporting structure chains;
   7) Solar panels and solar panel cables;
   8) A vehicle safety seat belt;
   wherein the rotational spoke-platform is mounted on top of the pedestal through a vertical axel of the pedestal connected by the bearing ring, with the plurality of spoke-platform wheels sitting on the pedestal tracks;
   wherein, the motor is connected to the rotational spoke-platform through engagement of the drive-loop chain by the motor sprocket gear and the spoke-platform sprocket gears;
   wherein the front supporting structure comprises a horizontal hinge and is mounted on the top of the spoke-platform connected to the pedestal spokes through two of the plurality of spoke-pedestal sprocket gears and associated spoke-pedestal wheels;
   wherein the rear supporting structure comprising rear supporting sprocket gears and rear supporting structure chains is also mounted on the top of the spoke-platform and connected to the spoke-pedestal two different spoke-pedestal sprocket gears and associated spoke-pedestal wheels;
   the solar panels are mounted on the supporting front and rear supporting structures; connected to the rear supporting structure chains through cables;
   the solar panels are further connected to the rear supporting structure through a vehicle safety seat belt;
   wherein, in operation, the motor drives the spoke-platform through the drive loop chain to rotate around the vertical axel of the pedestal;
   the rear support sprocket gears drive the rear support chains to lift the solar panels making them rotate around the hinge mounted on the front supporting structure;
   when wind is blowing from backside of the solar panels, the vehicle safety seat belt is configured to maintain the solar panels on the supporting structure.

2. The foldable portable load distributed lightweight dual-axis tracker with solar panels of claim 1, wherein, the motor including the motor sprocket gear is connected to the spoke-platform sprocket gears on the spokes of the spoke-platform through the drive loop chain to form a driving loop.

3. The foldable portable load distributed lightweight dual-axis tracker with solar panels of claim 1, wherein, the spoke-platform spokes are connected with foldable lattice girders.

4. The foldable portable load distributed lightweight dual-axis tracker with solar panels of claim 1, wherein, the front support structure comprises a horizontal hinge.

5. The foldable portable load distributed lightweight dual-axis tracker with solar panels of claim 1, wherein, the rear support structure has 2 columns with 2 rear supporting structure sprocket gears mounted on their top and 2 rear supporting structure sprocket gears mounted at their bottom, the 2 rear supporting structure sprocket gears on each of the column are connected through the rear support chain, 2 of the rear supporting structure sprocket gears or all of rear supporting structure sprocket gears contain motors.

6. The foldable portable load distributed lightweight dual-axis tracker with solar panels of claim 1, wherein, the solar panels are connected to the rear supporting structure chains, which are connected to the rear supporting structure sprocket gears on the rear supporting structure, through cables at their one ends.

7. The foldable portable load distributed lightweight dual-axis tracker with solar panels of claim 1, wherein, the solar panels are further connected to the rear supporting structure through the vehicle safety seat belt.

8. The foldable portable load distributed lightweight dual-axis tracker with solar panels of claim 1, wherein, the spoke-platform spokes are connected to the bearing ring through spoke-platform joints to make the spoke-platform foldable.

9. The foldable portable load distributed lightweight dual-axis tracker with solar panels of claim 1, wherein, the spoke-pedestal spokes are connected to the pedestal through pedestal joints to make the spoke-pedestal foldable.

* * * * *